United States Patent
Tikka et al.

(10) Patent No.: US 6,741,145 B2
(45) Date of Patent: May 25, 2004

(54) FILTER STRUCTURE AND ARRANGEMENT COMPRISING PIEZOELECTRIC RESONATORS

(75) Inventors: Pasi Tikka, Helsinki (FI); Juha Ellä, Halikko (FI)

(73) Assignee: Nokia Corporation, Espoo (FI)

( * ) Notice: Subject to any disclaimer, the term of this patent is extended or adjusted under 35 U.S.C. 154(b) by 7 days.

(21) Appl. No.: 09/989,020

(22) Filed: Nov. 20, 2001

(65) Prior Publication Data

US 2002/0093394 A1 Jul. 18, 2002

(30) Foreign Application Priority Data

Nov. 24, 2000 (FI) ................................ 20002585

(51) Int. Cl.[7] .............. H03H 9/54; H03H 9/56; H03H 9/64; H03H 9/70
(52) U.S. Cl. .............. 333/133; 333/189; 333/190; 333/193; 333/191
(58) Field of Search ................. 333/186–196, 333/133

(56) References Cited

U.S. PATENT DOCUMENTS

| | | | |
|---|---|---|---|
| 2,045,991 A | * 6/1936 | Mason | 333/190 |
| 2,222,417 A | * 11/1940 | Mason | 333/190 |
| 5,231,327 A | 7/1993 | Ketcham | 310/366 |
| 5,373,268 A | 12/1994 | Dworsky et al. | 333/187 |
| 5,404,628 A | 4/1995 | Ketcham | 29/25.35 |
| 5,949,306 A | * 9/1999 | Hickernell | 333/195 |
| 6,208,223 B1 | * 3/2001 | Shimamura et al. | 333/193 |
| 6,262,637 B1 | * 7/2001 | Bradley et al. | 333/133 |

FOREIGN PATENT DOCUMENTS

| | | | |
|---|---|---|---|
| EP | 0880227 A3 | | 4/2000 |
| EP | 1 030 448 | * | 8/2000 |
| EP | 1067685 A3 | | 6/2001 |
| EP | 1058383 A3 | | 11/2001 |
| EP | 1202454 A2 | | 5/2002 |
| JP | 7-74584 | * | 3/1995 |
| JP | 9-205343 | * | 8/1997 |
| JP | 10-303698 | * | 11/1998 |
| JP | 2001-156588 | * | 6/2001 |
| JP | 2001-285025 | * | 10/2001 |
| WO | WO 01/97375 A1 | | 12/2001 |

OTHER PUBLICATIONS

"Acoustic Bulk Wave Composite Resonators", Lakin et al., Applied Physics Letters, vol. 38, No. 3, pp. 125–127, Feb. 1981.

"An Air–Gap Type Piezoelectric Composite Thin Film Resonator", Hiroaki Satoh et al., 15 Proc. 39th Annual Symp. Freq. Control, pp. 361–366, 1985.

* cited by examiner

*Primary Examiner*—Barbara Summons
(74) *Attorney, Agent, or Firm*—Perman & Green, LLP

(57) ABSTRACT

A filter structure (1090, 1100, 1200) comprises a first piezoelectric resonator (1021*a*), whose resonance frequency is a first resonance frequency and which is connected to an input conductor (1030*a*, 1030*b*). In order to increase the power handling capacity of the filter structure, it comprises other piezoelectric resonators connected in series with the first piezoelectric resonator. In this plurality (1020, 1110, 1220) of piezoelectric resonators, each resonator has a resonance frequency substantially equal to the first resonance frequency. The plurality (1020, 1110, 1220) of piezoelectric resonators is connected to the rest of the filter structure only through the first piezoelectric resonator (1021*a*) at one end of said plurality and through a second piezoelectric resonator (1021*b*), which is at the other end said plurality. The impedance of said plurality is arranged to match the impedance level of the filter structure. An arrangement for transmitting and for transmitting and receiving radio frequency signal is also described.

32 Claims, 8 Drawing Sheets

Figure 1:
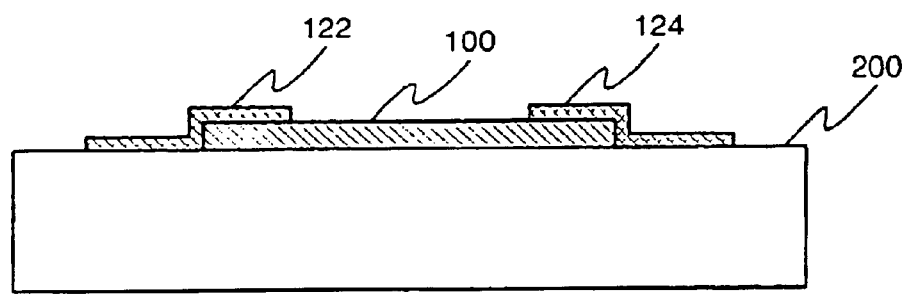

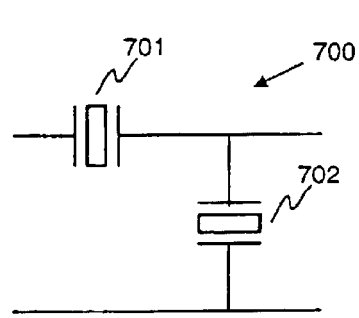
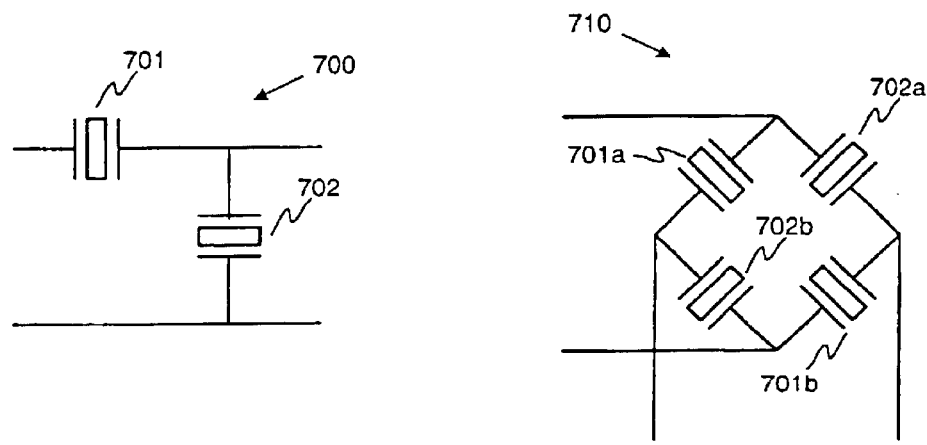
Fig. 7a
PRIOR ART
Fig. 7b
PRIOR ART
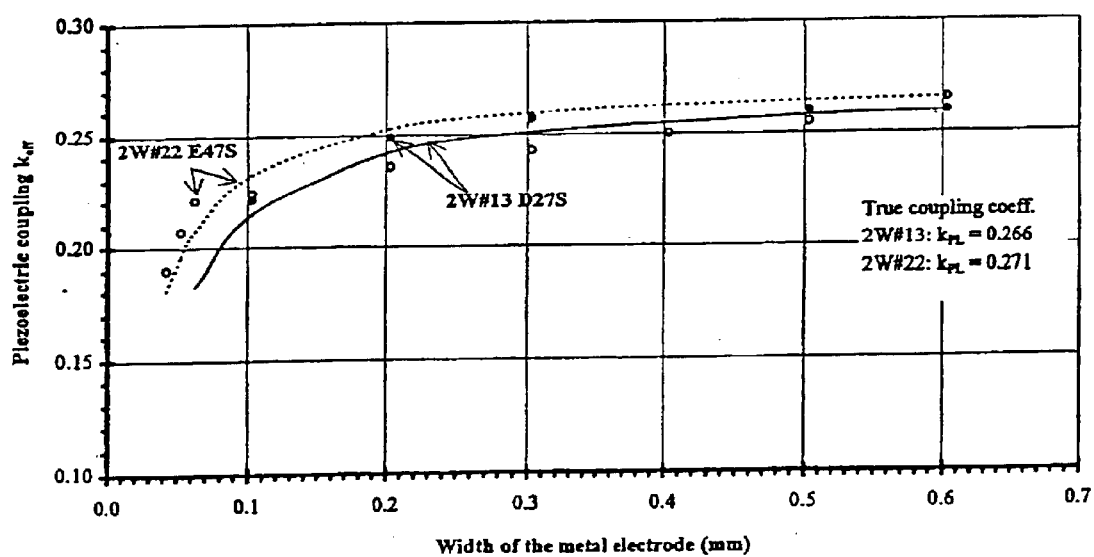
Fig. 8

FILTER STRUCTURE AND ARRANGEMENT COMPRISING PIEZOELECTRIC RESONATORS

The invention relates in general to radio frequency filter. In particular it relates to filter structures comprising piezoelectric resonators, typically thin film bulk acoustic wave (BAW) or surface acoustic wave (SAW) resonators.

The development of mobile telecommunications continues towards ever smaller and increasingly complicated handheld units. The development leads to increasing requirements on the miniaturization of the components and structures used in the mobile communication means. This development concerns radio frequency (RF) filter structures as well, which despite the increasing miniaturization should be able to withstand considerable power levels, have very steep passband edges, and low losses.

The RF filters used in prior art mobile phones are usually discrete surface acoustic wave (SAW) or ceramic filters. Surface acoustic wave (SAW) resonators typically have a structure similar to that shown in FIG. 1. Surface acoustic resonators utilize surface acoustic vibration modes of a solid surface, in which modes the vibration is confined to the surface of the solid, decaying quickly away from the surface. A SAW resonator typically comprises a piezoelectric layer 100, and two electrodes 122, 124. These electrodes form an Interdigital Transducer (IDT). The shape of the electrodes 122, 124 typically resembles letter E or a comb, and the electrodes are placed so that the fingers of a first electrode are parallel with the fingers of a second electrode and between them. The frequency of a SAW resonator depends most on the distance between the fingers and also on the width of the fingers. Impedance of a SAW resonator depends mostly on the number of fingers and on the length of the fingers. In addition to the IDT, a SAW resonator has typically two reflectors, one on each side of the IDT, for reflecting back the surface acoustic wave induced by the IDT and traversing in a direction normal to the direction of the fingers of the IDT.

Various resonator structures such as filters are produced with SAW resonators. A SAW resonator has the advantage of having a very small size, but unfortunately a SAW resonator cannot withstand high power levels.

It is known to construct thin film bulk acoustic wave resonators on semiconductor wafers, such as silicon (Si) or gallium arsenide (GaAs) wafers. For example, in an article entitled "Acoustic Bulk Wave Composite Resonators", Applied Physics Letters, Vol. 38, No. 3, pp. 125–127, Feb. 1, 1981, by K. M. Lakin and J. S. Wang, an acoustic bulk wave resonator is disclosed which comprises a thin film piezoelectric layer of zinc oxide (ZnO) sputtered over a thin membrane of silicon (Si). Further, in an article entitled "An Air-Gap Type Piezoelectric Composite Thin Film Resonator", I5 Proc. 39th Annual Symp. Freq. Control, pp. 361–366, 1985, by Hiroaki Satoh, Yasuo Ebata, Hitoshi Suzuki, and Choji Narahara, a bulk acoustic wave resonator having a bridge structure is disclosed.

Figure 2:
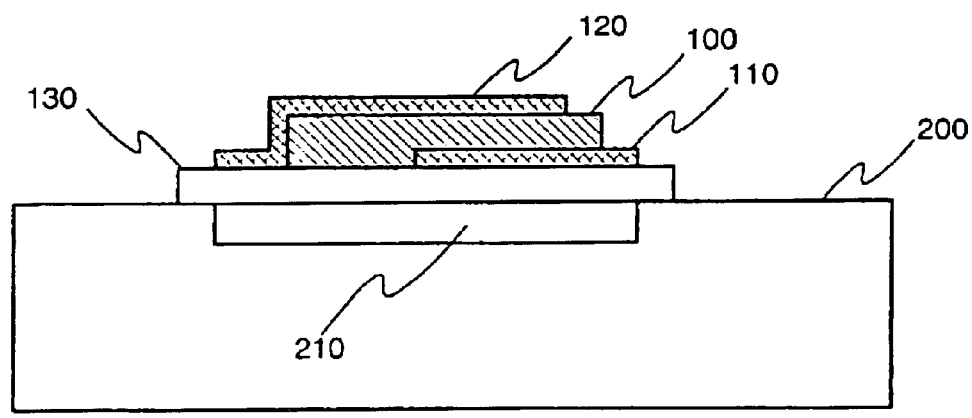

FIG. 2 shows one example of a bulk acoustic wave resonator having a bridge structure. The structure comprises a membrane 130 deposited on a substrate 200. The resonator further comprises a bottom electrode 110 on the membrane, a piezoelectric layer 100, and a top electrode 120. A gap 210 is created between the membrane and the substrate by etching away some of the substrate from the top side. The gap serves as an acoustic isolator, essentially isolating the vibrating resonator structure from the substrate.

In the following, certain types of BAW resonators are first described. Bulk acoustic wave resonators are typically fabricated on silicon (Si), gallium arsenide (GaAs), glass, or ceramic substrates. One further ceramic substrate type used is alumina. The BAW devices are typically manufactured using various thin film manufacturing techniques, such as for example sputtering, vacuum evaporation or chemical vapor deposition. BAW devices utilize a piezoelectric thin film layer for generating the acoustic bulk waves. The resonance frequencies of typical BAW devices range from 0.5 GHz to 5 GHz, depending on the size and materials of the device. BAW resonators exhibit the typical series and parallel resonances of crystal resonators. The resonance frequencies are determined mainly by the material of the resonator and the dimensions of the layers of the resonator.

A typical BAW resonator consists of three basic elements:

an acoustically active piezoelectric layer,
electrodes on opposite sides of the piezoelectric layer, and
acoustical isolation from the substrate.

The piezoelectric layer may be for example, ZnO, AlN, ZnS or any other piezo-electric material that can be fabricated as a thin film. As a further example, also ferroelectric ceramics can be used as the piezoelectric material. For example, $PbTiO_3$ and $Pb(Zr_xTi_{1-x})O_3$ and other members of the so called lead lanthanum zirconate titanate family can be used.

The material used to form the electrode layers is an electrically conductive material. The electrodes may be comprised of for example any suitable metal, such as tungsten (W), aluminum (Al), copper (Cu), molybdenum (Mo), nickel (Ni), titanium (Ti), niobium (Nb), silver (Ag), gold (Au), and tantalum (Ta). The substrate is typically composed of for example Si, $SiO_2$, GaAs, glass, or ceramic materials.

The acoustical isolation can be produced with for example the following techniques:

with a substrate via-hole,
with a micromechanical bridge structure, or
with an acoustic mirror structure.

In the via-hole and bridge structures, the acoustically reflecting surfaces are the air interfaces below and above the devices. The bridge structure is typically manufactured using a sacrificial layer, which is etched away to produce a free-standing structure. Use of a sacrificial layer makes it possible to use a wide variety of substrate materials, since the substrate does not need to be modified very much, as in the via-hole structure. A bridge structure can also be produced using an etch pit structure, in which case a pit has to be etched in the substrate or the material layer below the BAW resonator in order to produce the free standing bridge structure.

Figure 3:
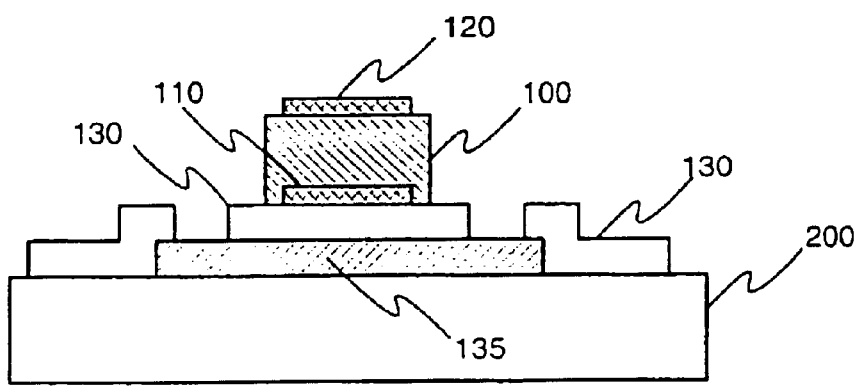

FIG. 3 illustrates one example of various ways of producing a bridge structure. Before the deposition of other layers of the BAW structure, a sacrificial layer 135 is deposited and patterned first. The rest of the BAW structure is deposited and patterned partly on top of the sacrificial layer 135. After the rest of the BAW structure is completed, the sacrificial layer 135 is etched away. FIG. 3 shows also the substrate 200, a membrane layer 130, the bottom electrode 110, the piezoelectric layer 100, and the top electrode 120. The sacrificial layer can be realized using for example ceramic, metallic or polymeric material.

Figure 4:
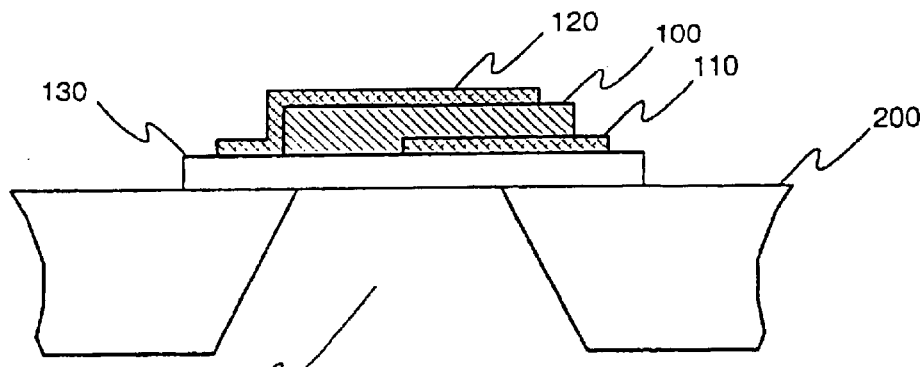

In the via-hole structure, the resonator is acoustically isolated from the substrate by etching away the substrate from under a major portion of the BAW resonator structure. FIG. 4 shows a via-hole structure of a BAW resonator. FIG. 4 shows the substrate 200, a membrane layer 130, the bottom electrode 110, the piezoelectric layer 100, and the top electrode 120. A via-hole 211 has been etched through the whole substrate. Due to the etching required, via-hole structures are commonly realized only with Si or GaAs substrates.

A further way to isolate a BAW resonator from the substrate is by using an acoustical mirror structure. The acoustical mirror structure performs the isolation by reflecting the acoustic wave back to the resonator structure. An acoustical mirror typically comprises several layers having a thickness of one quarter wavelength at the center frequency, alternating layers having differing acoustical impedances. The number of layers in an acoustic mirror is typically ranging from three to nine. The ratio of acoustic impedance of two consecutive layers should be large in order to present as low acoustic impedance as possible to the BAW resonator, instead of the relatively high impedance of the substrate material. In the case of a piezoelectric layer that is one quarter of the wavelength thick, the mirror layers are chosen so that as high acoustic impedance as possible is presented to the resonator. This is disclosed in U.S. Pat. No. 5,373,268. The material of the high impedance layers can be for example gold (Au), molybdenum (Mo), or tungsten (W), and the material of the low impedance layers can be for example silicon (Si), polysilicon (poly-Si), silicon dioxide ($SiO_2$), aluminum (Al), or a polymer. Since in structures utilizing an acoustical mirror structure, the resonator is isolated from the substrate and the substrate is not modified very much, a wide variety of materials can be used as a substrate. The polymer layer may be comprised of any polymer material having a low loss characteristic and a low acoustic impedance. Preferably, the polymer material is such that it can withstand temperatures of at least 350° C., since relatively high temperatures may be needed during deposition of other layers of the acoustical mirror structure and other structures. The polymer layer may be comprised of, by example, polyimide, cyclotene, a carbon-based material, a silicon-based material or any other suitable material.

Figure 5:
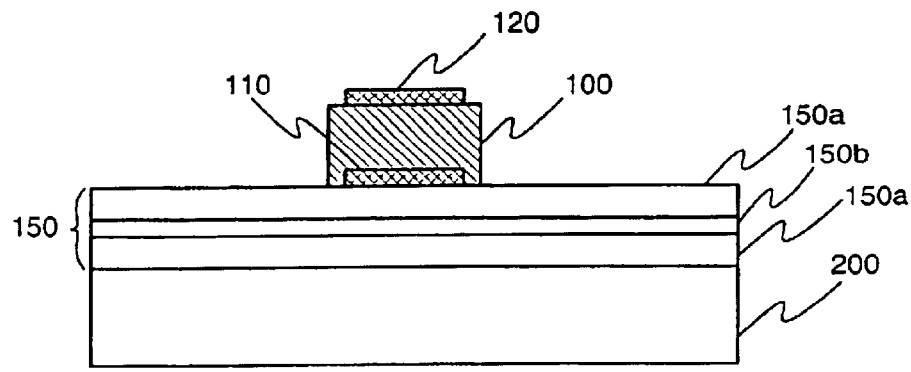

FIG. 5 shows an example of a BAW resonator on top of an acoustical mirror structure. FIG. 5 shows the substrate 200, the bottom electrode 110, the piezo-electric layer 100, and the top electrode 120. The acoustical mirror structure 150 comprises in this example three layers 150a, 150b. Two of the layers 150a are formed of a first material, and the third layer 150b in between the two layers is formed from a second material. The first and second materials have different acoustical impedances as described previously. The order of the materials can be varied. For example, the material with a high acoustical impedance can be in the middle and the material with a low acoustical impedance on both sides of the middle material, or vice versa. The bottom electrode may also be used as one layer of the acoustical mirror.

Figure 6:
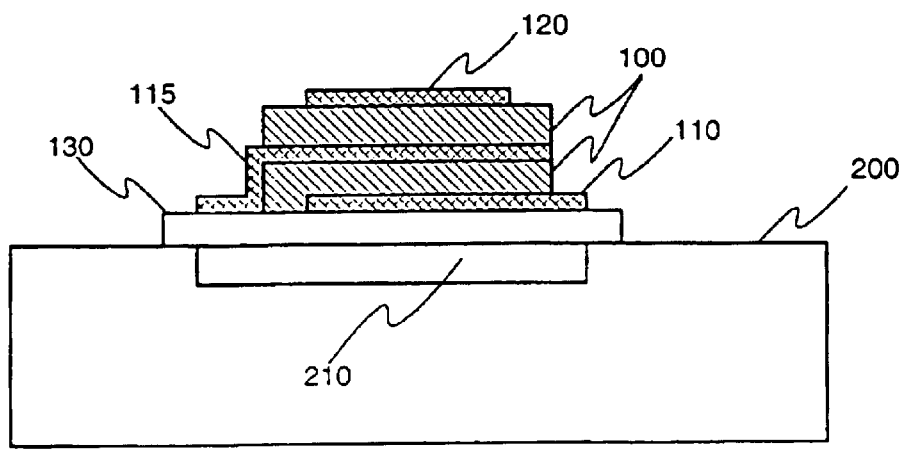

FIG. 6 shows a further example of a BAW resonator structure. The BAW resonator illustrated in FIG. 6 is a stacked resonator structure having two piezoelectric layers 100. In addition to the bottom 110 and top 120 electrodes, a stacked structure requires a middle electrode 115, which is connected to ground potential. FIG. 6 further shows the membrane layer 130, the substrate 200 and the etch pit 210 isolating the structure from the substrate.

Radio frequency filters, for example, may be constructed using piezoelectric resonators. The resonance frequencies of SAW resonators and of thin film BAW resonators are such that it is advantageous to use them in filters, which are designed to operate at a certain frequency band at a frequency range from about 1 GHz to a few GHz. FIG. 7a presents an example of a ladder filter block 700 consisting of a resonator 701 connected in series and of a second resonator 702 connected in parallel. The series resonance frequency of the resonator 701 is typically at or close to the parallel frequency of the resonator 702, which is the center frequency of the ladder filter block 700. A ladder filter is typically constructed by connecting a certain number of ladder filter blocks 700 in series, for achieving the desired characteristics of the filter. FIG. 7b presents an example of a lattice filter structure 710, where resonators 701a and 701b are connected in series and resonators 702a and 702b are connected in parallel.

The manufacture of piezoelectric resonators involves a step of depositing a layer of piezoelectric material on a substrate. Using, for example, a suitable mask, it is possible to pattern the piezoelectric layer so that it covers only the areas of the piezoelectric resonators. As many piezoelectric materials are hygroscopic, usually a protective layer is used to cover the piezoelectric layer. Generally vias, which expose the bottom electrode, are manufactured to an unpatterned piezoelectric layer and to the protective layer. If the piezolayer is suitably patterned, it may be enough to make vias to the protective layer. The vias enable the connection of the bottom and top electrodes at desired places: conductive strips connected to the bottom electrodes become exposed, and the piezoelectric resonators can be easily connected to the rest of the electrical circuitry.

U.S. Pat. Nos. 5,231,327 and 5,404,628 describe a method for minimizing the number of vias in circuitries comprising BAW resonators: a BAW resonator in a circuitry can be replaced by a pair of BAW resonators having a shared electrode. This way the electrodes, using which the pair of BAW resonators is connected to the other circuitry, are on the same side of an unpatterned piezoelectric layer and the connection of the piezoelectric resonators to the other circuitry on the same substrate is possible even without making vias to the piezoelectric layer or patterning the piezoelectric layer.

In general, one aim in circuit design in to keep the number of resonators, as well as the number of other components, as small as possible. This way the manufacture costs can usually be kept as low as possible. Furthermore, typically a larger number of components in a circuitry, for example in a filter, causes larger attenuation. In filters where it is acceptable to use a patterned piezoelectric layer in the filter structure (in other words, the manufacture of which filters involves a patterning of the piezoelectric layer), it seems inefficient to use, for example, resonator pairs instead of single resonators.

As desirable as the use of SAW or BAW resonators would be in radio frequency filters and in other circuitry, unfortunately neither SAW resonators nor BAW resonators can withstand high power levels. The power handling capacity of radio frequency filters is crucial for, for example, transmitters of mobile communication devices. When too high a power level is exerted on a circuitry, the BAW resonators typically break so fast that it is difficult to analyze the cause of the breakdown. Often such a BAW resonator is so badly destroyed in the breakdown that only the bottom electrode resides on the substrate after the breakdown.

A further problem is that at power levels, which do not damage piezoelectric resonators of a filter, the heat load may cause the temperature of piezoelectric resonators to increase. This, in turn, typically causes the resonance frequencies of the piezoelectric resonators to change and the characteristics of a filter to change. For example, increase in temperature may cause the band pass of a filter to shift.

An object of the invention is to present a filter structure, which comprises piezoelectric resonators and which has good power handling capacity and good electric response. A second object of the invention is to present a transmitting arrangement which has good power handling capacity. A further object is to present a method for designing such electrical circuitry, which comprises piezoelectric resonators and has good power handling capacity and good electric response.

Objects of the invention are achieved by using in a filter structure at least one group of piezoelectric resonators, which all have a certain resonator frequency, which are connected in series with each other and which are connected to an input conductor of the filter structure.

The invention relates to a filter structure having a certain impedance level and comprising a first piezoelectric resonator, whose resonance frequency is a first resonance frequency and which is connected to an input conductor of said filter structure, said filter structure further comprising, in order to increase the power handling capacity of the filter structure, a chain of piezoelectric resonators, said chain comprising at least two piezoelectric resonators, connected in series with the first piezoelectric resonator and forming together with the first piezoelectric resonator a plurality of piezoelectric resonators connected in series, and wherein each piezoelectric resonator belonging to said chain of piezoelectric resonators has a resonance frequency substantially equal to the first resonance frequency,
said plurality of piezoelectric resonators is connected to the rest of the filter structure only through the first piezoelectric resonator at one end of said plurality of piezoelectric resonators connected in series and through a second piezoelectric resonator, which is at the other end of said plurality of piezoelectric resonators connected in series, and
impedance of said plurality of piezoelectric resonators connected in series is arranged to match the impedance level of the filter structure.

The invention relates also to a filter structure having a certain impedance level and comprising a first surface acoustic wave resonator, whose resonance frequency is a first resonance frequency and which is connected to an input conductor of said filter structure, said filter structure further comprising, in order to increase the power handling capacity of the filter structure, a second surface acoustic wave resonator, a first electrode of said first surface acoustic wave resonator being connected to a first electrode of said second surface acoustic wave resonator, and said second surface acoustic wave resonator forming together with the first surface acoustic wave resonator a plurality of piezoelectric resonators connected in series, and wherein each piezoelectric resonator belonging to said plurality of piezoelectric resonators has a resonance frequency substantially equal to the first resonance frequency,
said plurality of piezoelectric resonators is connected to the rest of the filter structure only through a second electrode of the first surface acoustic wave resonator and through a second electrode of the second surface acoustic wave resonator, and
impedance of said plurality of piezoelectric resonators connected in series is arranged to match the impedance level of the filter structure.

The invention further relates to a filter structure having a certain impedance level and comprising a first bulk acoustic wave resonator, whose resonance frequency is a first resonance frequency and which is connected to an input conductor of said filter structure, said filter structure further comprising, in order to increase the power handling capacity of the filter structure, a second bulk acoustic wave resonator, a first electrode of said first bulk acoustic wave resonator being connected to a first electrode of said second bulk acoustic wave resonator, and said second bulk acoustic wave resonator forming together with the first bulk acoustic wave resonator a plurality of piezoelectric resonators connected in series, and wherein each piezoelectric resonator belonging to said plurality of piezoelectric resonators has a resonance frequency substantially equal to the first resonance frequency,
said plurality of piezoelectric resonators is connected to the rest of the filter structure only through a second electrode of the first bulk acoustic wave resonator and through a second electrode of the second bulk acoustic wave resonator,
the first bulk acoustic wave resonator and the second bulk acoustic wave resonator are not formed using a single unpatterned piezoelectric layer, and
impedance of said plurality of piezoelectric resonators connected in series is arranged to match the impedance level of the filter structure.

The invention further relates to a filter structure comprising a first filter branch for filtering a first signal, said first filter branch having a first input conductor, a first output conductor and a plurality of piezoelectric resonators connected in series, said plurality having at least two piezoelectric resonators, and
a second filter branch for filtering a second signal, said second filter branch having a second input conductor and a second output conductor and said first output conductor being connected to said second input conductor, wherein
each piezoelectric resonator belonging to said plurality of piezoelectric resonators has a substantially same resonance frequency,
said plurality of piezoelectric resonators is connected to the rest of the first filter branch only through a first piezoelectric resonator at one end of said plurality of piezoelectric resonators connected in series, said first piezoelectric resonator being connected to the first input conductor, and through a second piezoelectric resonator, which is at the other end of said plurality of piezoelectric resonators connected in series, and
impedance of said plurality of piezoelectric resonators connected in series is arranged to match the impedance level of the first filter branch.

The invention relates also to an arrangement for transmitting and receiving radio frequency signal, said arrangement comprising first amplification means for amplifying a first signal,
second amplification means for amplifying a second signal, and a filter structure comprising a first filter branch for filtering the first signal, said first filter branch having a first input conductor, a first output conductor and a plurality of piezoelectric resonators connected in series, said plurality having at least two piezoelectric resonators, and a second filter branch for filtering the second signal, and said second filter branch having a second input conductor and a second output conductor, wherein said first output conductor is connected to said second input conductor, said first input conductor is coupled to an output of the first amplification means and said second output conductor is coupled to an input of the second amplification means, each piezoelectric resonator belonging to said plurality of piezoelectric resonators has a substantially same resonance frequency, said plurality of piezoelectric resonators is connected to the rest of the first filter branch only through a first piezoelectric resonator at one end of said plurality of piezoelectric resonators connected in series, said first piezoelectric resonator being connected to the first input conductor, and through a second piezoelectric resonator, which is at the other end said plurality of piezoelectric resonators connected in series, and impedance of said plurality of piezoelectric resonators connected in series is arranged to match the impedance level of the first filter branch.

The invention further relates to an arrangement for transmitting radio frequency signal, comprising amplification means for amplifying a radio frequency signal, and a filter structure for filtering the amplified radio frequency signal, said filter structure comprising a plurality of piezoelectric resonators connected in series, said plurality having at least two piezoelectric resonators, wherein each piezoelectric resonator belonging to said plurality of piezoelectric resonators has a substantially same resonance frequency, said plurality of piezoelectric resonators is connected to the rest of the filter structure only through a first piezoelectric resonator at one end of said plurality of piezoelectric resonators connected in series, said first piezoelectric resonator being connected to an input conductor of said filter structure, and through a second piezoelectric resonator, which is at the other end of said plurality of piezoelectric resonators connected in series, and impedance of said plurality of piezoelectric resonators connected in series is arranged to match the impedance level of the filter structure.

A method according to the invention is a method for designing a filter comprising the following steps of:

specifying a filter construction, which comprises piezoelectric resonators, said filter construction achieving a target frequency response, replacing in the filter construction an original piezoelectric resonator having a first resonance frequency with a plurality of piezoelectric resonators, each of which has a resonance frequency substantially equal to the first resonance frequency, which are connected in series, and the impedance of the plurality of resonators being connected in series being the same as the impedance of the original piezoelectric resonator, and selecting the number of piezoelectric resonators in said plurality of piezoelectric resonators.

The accompanying dependent claims describe some preferred embodiments of the invention.

The breakdown of a piezoelectric BAW resonator may be caused by an electrical breakdown caused by a high voltage and/or by the amplitude of the piezoelectrically excited mechanical vibrations of the resonator. The electrical breakdown and amplitude of mechanical vibrations that should not be exceeded suggest that there is an upper limit for the voltage which can be exerted over a piezoelectric resonator without damaging the resonator. When instead of a single piezoelectric resonator a number of piezoelectric resonators connected in series are used, the voltage exerted over each piezoelectric resonator is decreased. The upper limit for the voltage is thus reached at higher power than when a single piezoelectric resonator is used.

In piezoelectric SAW resonators, the voltage exerted over a SAW resonator is a significant factor causing damage to SAW resonators. Therefore a filter structure, where there are a number of piezoelectric SAW resonators connected in series, has a better power handling capacity than a filter structure having a single corresponding SAW resonator.

As the impedance of a number of piezoelectric resonators connected in series typically needs to be match with the resonance of the filter circuitry, the capacitance of the individual piezoelectric resonators belonging to the series of piezoelectric resonators are larger than the capacitance of a single piezoelectric resonator. The capacitance of a piezoelectric BAW resonator, for example, is proportional to the area of a resonator. Therefore the impedance matching causes the total area of the piezoelectric BAW resonators connected in series to be considerably larger than the area of a single piezoelectric BAW resonator. The impedance of a SAW resonator depends mostly on the number of fingers and on the length of the fingers. Similarly, the area of a plurality of piezoelectric SAW resonators connected in series and having a suitable impedance is typically larger than that of a single SAW resonator. The increased area enhances the heat transfer from the piezoelectric resonators to the substrate, and the temperature of a number of piezoelectric resonators connected in series increases typically less than the temperature of a single piezoelectric resonator in same circumstances. This helps to maintain the characteristics of a filter or other circuitry unchanged. Furthermore, it is possible that the breakdown of piezoelectric resonators is—at least partly—caused by too high a temperature. The increased heat transfer capacity may thus directly enhance also the power handling capacity of a circuitry comprising piezoelectric resonators.

The attenuation of a filter comprising a number of piezoelectric BAW resonators connected in series is typically not significantly increased when compared to a filter comprising a corresponding single piezoelectric BAW resonator. This is due to the fact that as the area of a piezoelectric BAW resonator increases, the effective piezoelectric coupling coefficient of a piezoelectric BAW resonator increases. This is mostly due to the decreasing effect of the stray capacitance. The effective piezoelectric coupling coefficient is a measure of how efficiently a voltage exerted on a piezoelectric resonator is turned into mechanical vibrations in the piezoelectric resonator, and it is strongly dependent on the frequency of the exerted voltage. Thus, even though each piezoelectric BAW resonator increases the attenuation of the filter, the band pass of a filter can be designed to be a bit wider (the increased effective coupling coefficient enables this) and the increase in attenuation can be at least partly compensated.

When power handling capacity of a filter causes concern, the use of a number of piezoelectric resonators connected in series is thus advantageous in filter structures, irrespective of the manufacture of the piezoelectric resonators involving patterning of a piezoelectric layer or not. As the number and area of the piezoelectric resonators increases, the area of the filter structure typically increases. The advantages of using a number of piezoelectric resonators connected in series are, however, in many situations so significant that the increase in the filter area is acceptable. The area required to fit in a filter comprising thin-film piezoelectric resonators connected in series is considerably smaller than, for example, an area required to fit in a ceramic filter. Ceramic filters are nowadays used, for example, in cellular telephones.

Figure 9:
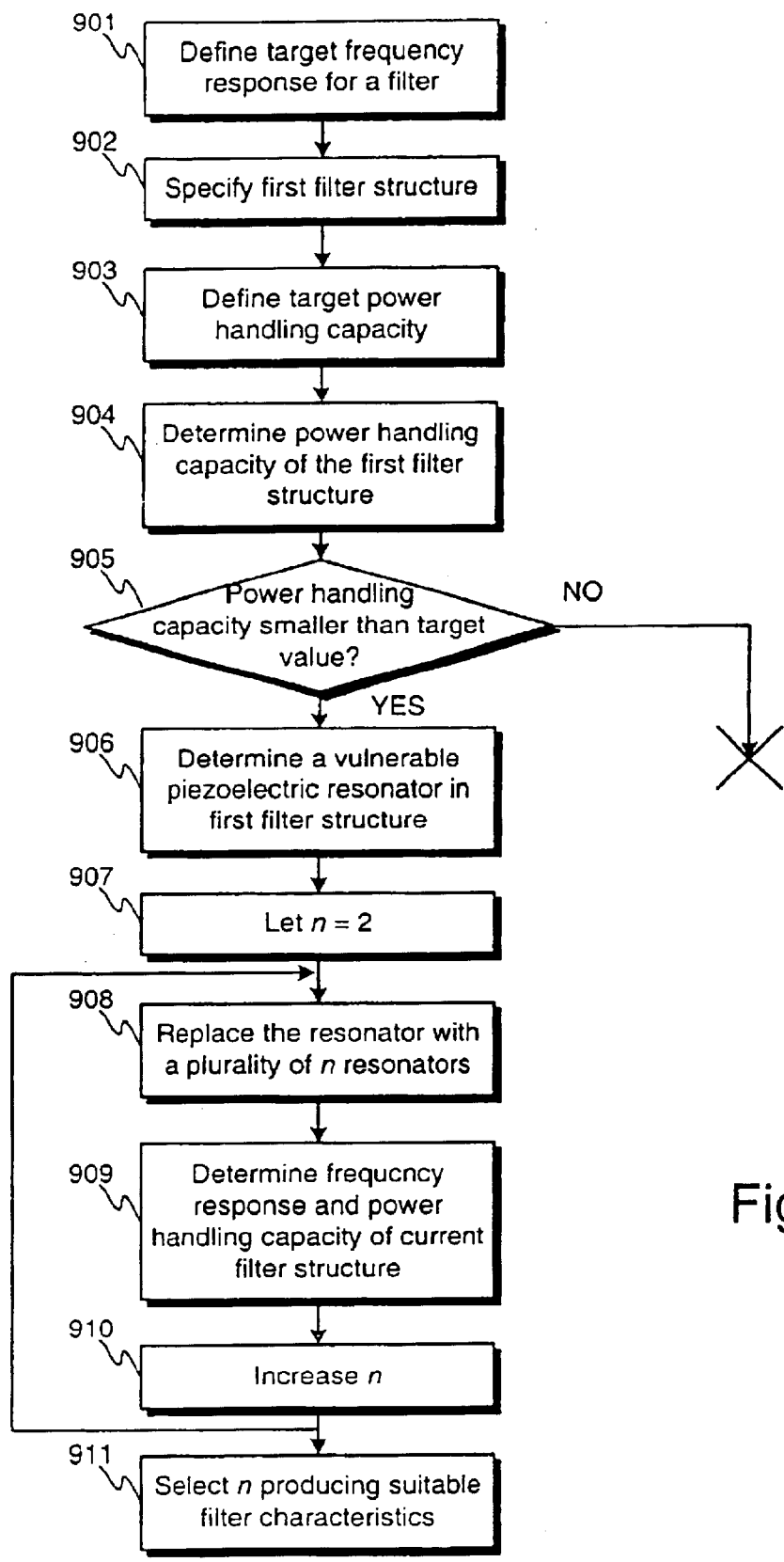
Figure 10:
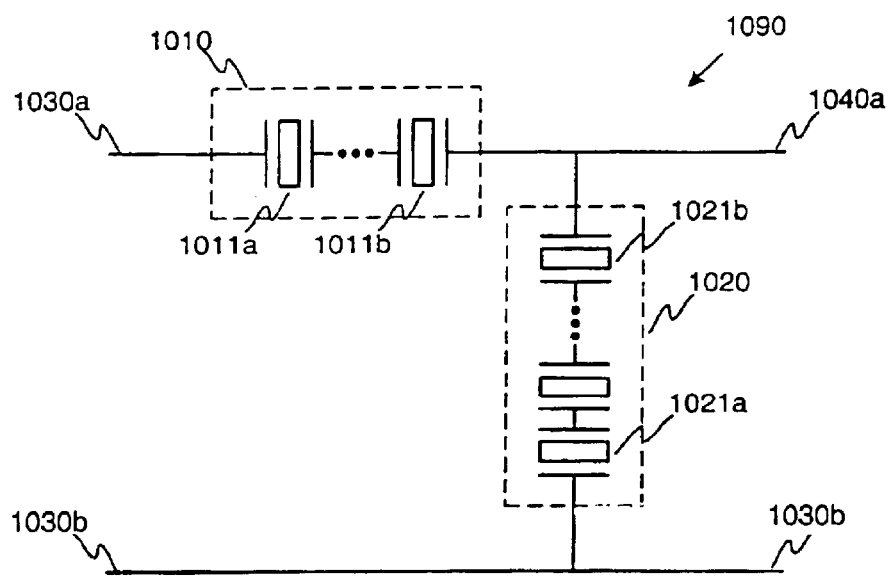
Figure 11:
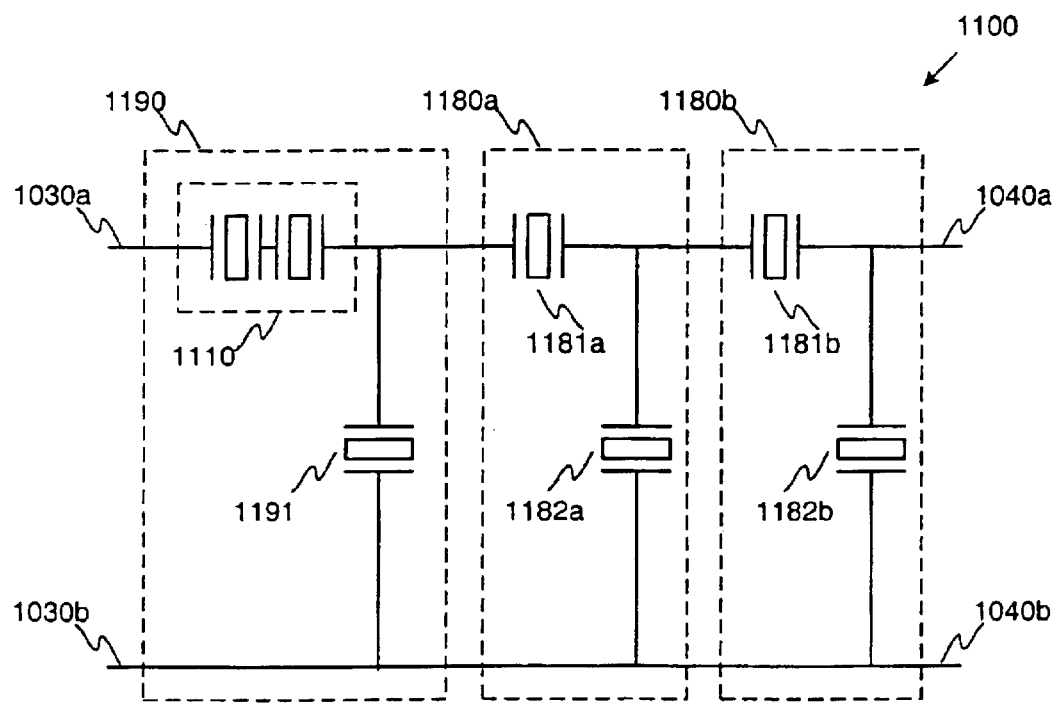
Figure 12:
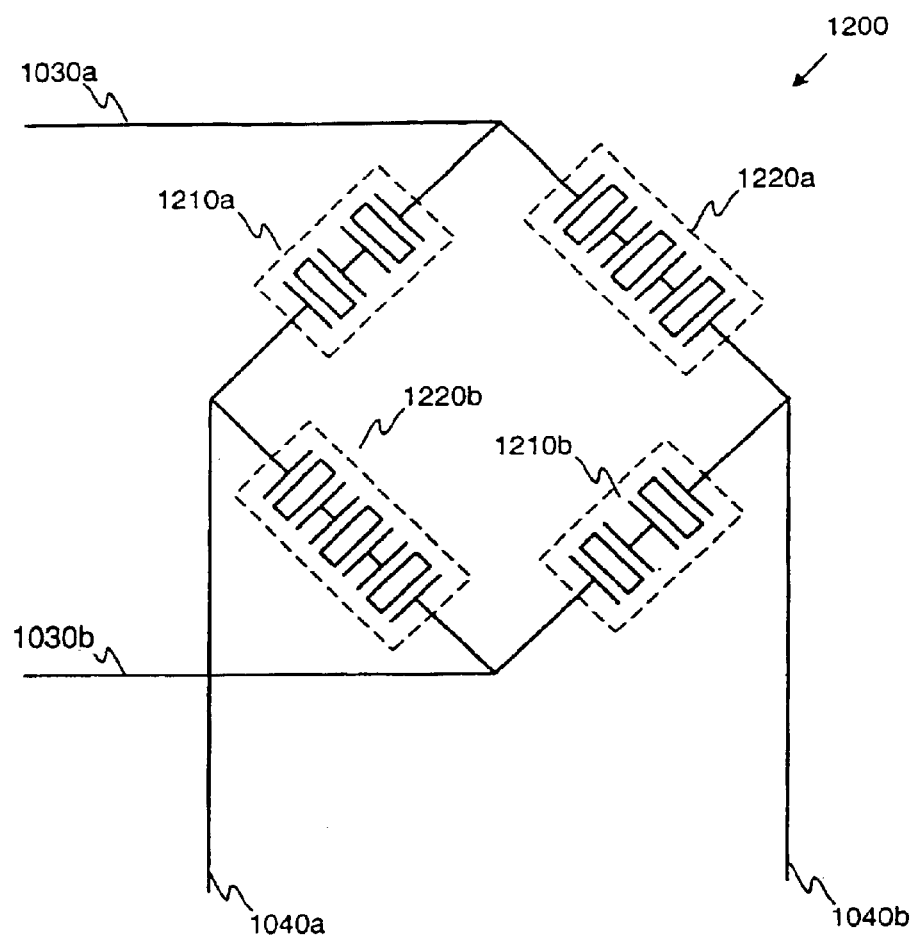
Figure 14:
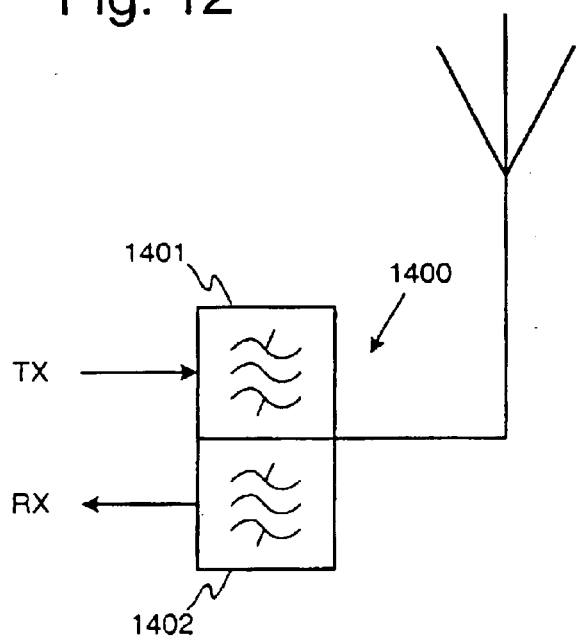
Figure 15:
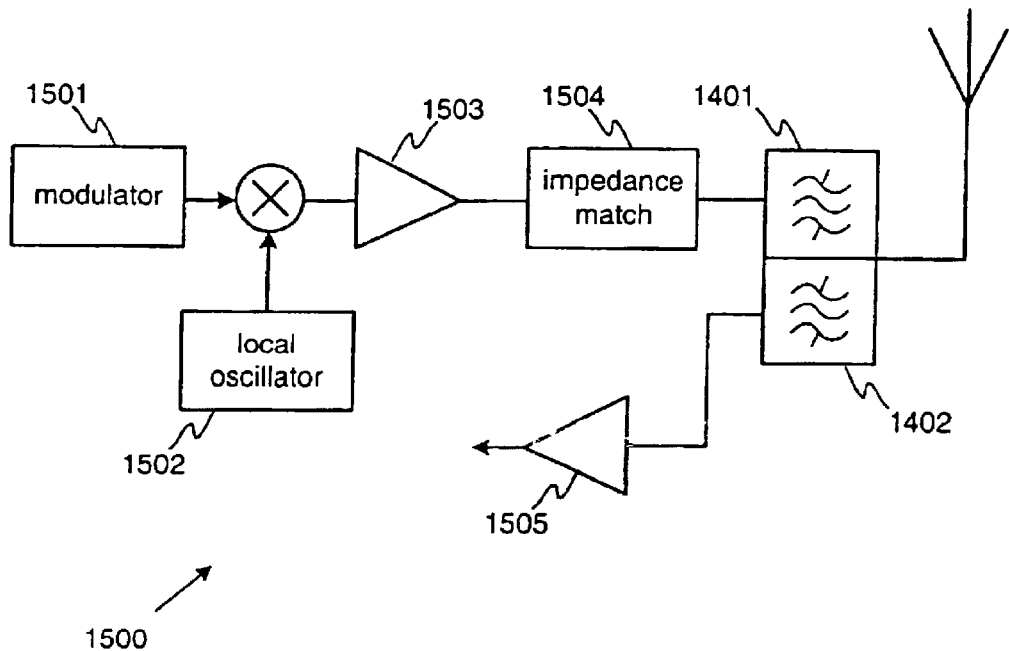
Figure 16:
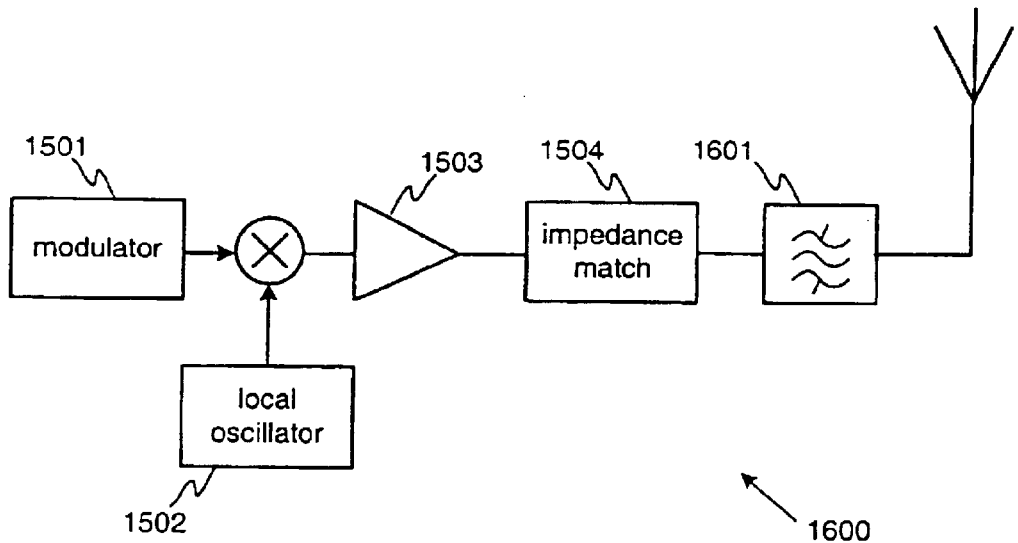

The invention will now be described more in detail with reference to the preferred embodiments by the way of example and to the accompanying drawings where FIG. 1 illustrates a surface acoustic resonator according to prior art, FIG. 2 illustrates a bulk acoustic wave resonator according to prior art, FIG. 3 shows another bulk acoustic wave resonator structure having a bridge structure, FIG. 4 illustrates a bulk acoustic wave resonator having a via-hole structure, FIG. 5 illustrates a bulk acoustic wave resonator isolated from the substrate by an acoustic mirror structure, FIG. 6 illustrates a stacked bulk acoustic wave resonator, FIGS. 7A&7B illustrate an example of a prior art ladder filter block and an example of a prior art lattice filter structure, FIG. 8 illustrates the effective piezoelectric coupling coefficient as a function of the width of an electrode of a BAW resonator, FIG. 9 illustrates a flowchart of a method for designing a filter structure according to a first preferred embodiment of the invention, FIG. 10 illustrates as an example a ladder filter block according to a second preferred embodiment of the invention, FIG. 11 illustrates as an example a ladder filter according to a third preferred embodiment of the invention, FIG. 12 illustrates as an example a lattice filter structure according to a fourth preferred embodiment of the invention, FIG. 13 illustrates two examples of implementing a filter structure presented in FIG. 11, FIG. 14 illustrates as an example a duplex filter structure in accordance with the invention, FIG. 15 illustrates as an example an arrangement for transmitting and receiving a radio frequency signal in accordance with the invention, and FIG. 16 illustrates as an example an arrangement for transmitting a radio frequency signal in accordance with the invention.

Above in conjunction with the description of the prior art reference was made to FIGS. 1–7. The same reference numerals are used for corresponding parts in the figures.

We shall first discuss briefly the effect of the size of the electroded area A of a BAW resonator on the effective piezoelectric coupling coefficient keff. An upper limit for the effective piezoelectric coupling coefficient is the true piezoelectric coupling coefficient, which depends mainly on the piezoelectric material used in a BAW resonator.

It is possible to determine the effective piezoelectric coupling coefficient of a resonator by measuring a parallel resonance frequency and a serial resonance frequency of the resonator: the effective piezoelectric coupling coefficient can be calculated using the difference between these resonance frequencies. FIG. 8 shows with open and filled circles the effective piezoelectric coupling coefficient at 2 GHz for, respectively, two sets of BAW resonators, where the piezoelectric material is ZnO. The electroded area of the BAW resonators under study is square, and the width of the square is represented on the horizontal axis. The size of the BAW resonators under study is from about 50×50 $\mu m^2$ to about 600×600 $\mu m^2$.

The parallel capacitance of a BAW resonator is $C_0 = C_{PL} + C_S \cdot C_{PL}$ is the plate capacitance of the electroded area of a BAW resonator $C_{PL} = \epsilon_0 \epsilon_T A/t$, where $\epsilon_0$ is the permittivity of free space, $\epsilon_r$ is the relative permittivity of the piezoelectric material, A is the electroded area of the BAW resonator and t is the thickness of the piezoelectric layer. $C_S$ is the stray capacitance relating to the finite electroded area causing the electric field to leak out from between the electrodes of the BAW resonator. The stray capacitance can be estimated using generally known formulas.

The mechanical capacitance $C_m$ of a resonator can be derived from the plate capacitance and the true piezoelectric coupling coefficient k using $C_m = C_{PL}/(k^{-2}-1)$. The effective coupling coefficient is then $$k_{eff} = \sqrt{\frac{C_m}{C_0 + C_m}},$$

which is a function of the electroded area A. It is possible to fit this function to measured value of the effective piezoelectric coupling coefficient and obtain an estimate for the true piezoelectric coupling coefficient k. FIG. 8 shows the results of the fitting as a solid line and a dashed line. For the resonators marked with open circles, a value of k=0.271 is obtained for the true piezoelectric coupling coefficient. For the resonators marked with filled circles, a value of k=0.266 is obtained. As can be seen in FIG. 8, for BAW resonators under study, whose area is about 250×250 $\mu m^2$ or larger, the effective piezoelectric coupling coefficient is quite near the true piezoelectric coupling coefficient. For BAW resonators under study having an area less than 200×200 $\mu m^2$, the effect of the stray capacitance $C_S$ is clearly visible: the effective piezoelectric coupling coefficient is considerably smaller than the true piezoelectric coupling coefficient.

The impedance of the filter is typically matched to a certain impedance level, often to 50 Ohm impedance. The impedance of a piezoelectric BAW resonator is mainly due to the parallel capacitance $C_0$, and therefore the impedance matching results in that the capacitances of individual BAW resonator connected in series are larger than the capacitance of the combination of said BAW resonators. Thus, when a group of BAW resonators are connected in series to replace a single BAW resonator having the same impedance, the area of the group of BAW resonators is considerably larger than that of the single BAW resonator. For example, a single BAW resonator having a size of 200×200 $m^2$ may be replaced with two 282×282 $\mu m^2$ BAW resonators or with three 346×346 $\mu m$ BAW resonators connected in series. The area of resonators connected in series need not be the same, but usually they have the same size. If n BAW resonators having a certain area a and being connected in series are replacing a single BAW resonator having the area A, the area a of each BAW resonator is substantially nA to obtain impedance matching. As discussed above, the effective piezoelectric coupling coefficient of an individual BAW resonator increases with the area of the BAW resonator. Therefore the attenuation losses due to the increased number of resonators in a filter structure can be at least partly compensated by designing the filter to operate at a slightly wider frequency band.

In filters, where SAW resonators are used, attenuation may increase as the number of SAW resonator increases. On the other hand, the coupling coefficients of SAW resonators are quite good—at least when compared to those of BAW resonators—so in many cases a slight increase in attenuation is tolerable.

FIG. 9 presents a flowchart of a method 900 according to a first preferred embodiment of the invention for designing a filter comprising piezoelectric resonators. In step 901 a target frequency response for the filter is defined. For example, the filter may be a band pass filter having a passing band at 1805–1880 MHz or at 925–960 MHz. In step 902, a first filter construction, which achieves the defined target frequency response, is specified. This filter construction may be a typical prior art filter construction, where the number of piezoelectric resonators connected through vias to the filter circuitry is kept as low as possible. Step 901 and 902 are present in practically all filter design procedures.

In step 903 a target power handling capacity for the filter is defined, and in step 904 a power handling capacity of the first filter construction is determined. The power handling capacity of a filter can be determined, for example, by analyzing the filter structure and its behavior during operation theoretically or using simulation, or by testing a manufactured filter with input signals having increasing power levels.

If the power handling capacity of the first filter construction is below the target power handling capacity (step 905), a second filter construction is specified in step 908 by replacing in the first filter construction an original piezoelectric resonator having a first resonance frequency with a plurality of piezoelectric resonators, each of which has a resonance frequency substantially equal to the first resonance frequency, which are connected in series and the impedance of the plurality of resonators being connected in series being the same as the impedance of the original piezoelectric resonator or an original resonance arrangement (if the plurality replaces a certain number of original piezoelectric resonators) in the first filter construction. It is possible to place in the second filter construction one plurality of piezoelectric resonators connected in series or more than one such pluralities. For example, it is possible to determine (in step 906)—again for example either theoretically, for example using simulations, or by testing—which piezoelectric resonator(s) in the first filter construction is (are) most vulnerable to breakdown at the presence of high power levels. The piezoelectric resonator(s), which is (are) most vulnerable, may depend on the frequency of the input signal and on the structure of the filter. For example, the piezoelectric resonator (or resonance arrangement) being exposed to the highest voltage is generally the first (towards the inputs) piezoelectric resonator (resonance arrangement). At frequencies near the lower edge of the band pass, the first piezoelectric resonator in parallel is typically the most vulnerable. At frequencies near the higher edge of the band pass, the first piezoelectric resonator in series is typically the most vulnerable. Therefore it may be advisable to place a first plurality of piezoelectric resonators connected in series as the first piezoelectric resonance arrangement in series in the second filter structure and a second plurality of piezoelectric resonators connected in series as the first piezoelectric resonance arrangement in parallel in the second filter structure. The numbers of piezoelectric resonators in these first and second pluralities may be equal or different. It may alternatively be sufficient to replace only one of the first piezoelectric resonators (piezoelectric resonance arrangements) in series and in parallel with a plurality of piezoelectric resonators connected in series. Furthermore, there may be need to replace also other piezoelectric resonators in the first filter construction with pluralities of piezoelectric resonators connected in series.

As discussed above, the number of piezoelectric resonators connected in series and replacing the original piezoelectric resonator in the first filter construction affects the attenuation and the frequency response of the second filter construction. Increasing the number of piezoelectric resonator in the plurality of piezoelectric resonators typically increases the power handling capacity of the second filter structure, but it may also increase the attenuation of the second filter structure and modify the frequency response of the second filter structure. A somewhat larger attenuation may in some cases be ignored, as the power handling requirements may indicate that the filter is specifically designed for use in high power region, where an increased attenuation typically does not cause problems. Therefore, there typically is a need for finding a suitable balance between at least the power handling capacity of the second filter structure and the frequency response of the second filter construction by selecting the number of piezoelectric resonators connected in series. Alternatively, it is also possible to prioritize the power handling capacity.

In method 900 the number n of piezoelectric resonators connected in series is selected, as an example, be trying a few possibilities, starting from n=2 (step 907). First a piezoelectric resonator in the first filter structure, which is to be replaced with n piezoelectric resonators connected in series and having the same combined impedance as the original piezoelectric resonator is defined in step 906 and replaced with the plurality of resonators in step 908. Thereafter the power handling capacity and the frequency response of the current second filter construction are defined in step 909. The number n of piezoelectric resonators in said plurality is increased in step 910 and steps 908–910 are repeated for a certain number of times; an upper limit for n may, for example, result from the space available for the filter construction. Thereafter the value of n causing a suitable (usually best possible) combination of the power handling capacity and frequency response is selected in step 911.

Method 900 is just an example of a method for adjusting the power handling capacity of a filter structure. It is, of course, possible to use a more elaborate method, where various piezoelectric resonators in the first filter construction are replaced with pluralities of piezoelectric resonators connected in series. Alternatively, it is possible to use method 900 independently for different frequencies (i.e. to select different piezoelectric resonators in step 906) and using the results then determine a most suitable filter structure.

Using method 900 or other similar method it is possible to modify a prior art filter structure comprising piezoelectric resonators so that it has better power handling capacity.

FIG. 10 illustrates as an example a circuit corresponding to a ladder filter block 1090 according to a second preferred embodiment of the invention. This ladder filter block 1090 comprises a first plurality 1010 of piezoelectric resonators, which have a certain first resonance frequency and which are connected in series, and a second plurality 1020 of piezoelectric resonators, which have a certain second resonance frequency (typically different from the first resonance frequency) and which are connected in series. In ladder filter block 1090, the first plurality 1010 of piezoelectric resonators is connected in series and the second plurality 1020 of piezoelectric resonators is connected in parallel between the input conductors 1030a, 1030b and output conductors 1040a, 1040b. The three dots in pluralities 1010 and 1020 in FIG. 10 refer to a number (said number >0) of piezoelectric resonators connected in series between the furthermost piezoelectric resonators 1011a, 1011b, 1021a, 1021b in FIG. 10. This number of piezoelectric resonators may be any positive integer or zero. In FIG. 10, the plurality 1010 thus comprises at least two piezoelectric resonators and the plurality 1020 comprises at least three piezoelectric resonators. This is an example, and it is possible, for example, that in a filter structure according to the invention a plurality of piezoelectric resonators connected in parallel between the input and output conductors (i.e. a plurality corresponding to plurality 1020 in block 1090) comprises at least two piezoelectric resonators and/or a plurality of piezoelectric resonators connected in series between the input and output conductors (i.e. a plurality corresponding to plurality 1010 in block 1090) comprises at least three resonators.

The plurality 1010, 1020 of piezoelectric resonators connected in series comprises a first piezoelectric resonator 1011a, 1021a at one end of said plurality of piezoelectric resonators connected in series and a second piezoelectric resonator 1011b, 1021b at the other end of said plurality. The plurality 1010, 1020 of piezoelectric resonators connected in series is connected to the other ladder filter block 1090 only through the first piezoelectric resonator 1011a, 1021a and the second piezoelectric resonator 1011b, 1021b. The impedances of the pluralities 1010, 1020 of piezoelectric resonators, respectively, are matched to the target impedance of the ladder filter block 1090.

FIG. 11 illustrates as an example a circuit corresponding to a ladder filter 1100 according to a third preferred embodiment of the invention. This ladder filter 1100 comprises of three ladder filter blocks. The first of them, the ladder filter block 1190 comprises a plurality 1110 of piezoelectric resonators, which are connected in series and which have the same resonance frequency, connected in series between the input conductors 1030a, 1030b and the output conductors 1040a, 1040b, and a piezoelectric resonator 1191 connected in parallel between the input and output conductors. As an example, the plurality 1110 in FIG. 11 consists of two piezoelectric resonators, but their number may be larger in other ladder filters in accordance with the invention. The ladder filter blocks 1180a and 1180b are connected in series with the ladder filter block 1190. The ladder filter blocks 1180a and 1180b each comprise a piezoelectric resonator 1181a, 1181b connected in series and a piezoelectric resonator 1182a, 1182b connected in parallel between the input and output conductors.

The plurality 1110 of piezoelectric resonators serves in ladder filter 1100 as the first piezoelectric resonance arrangement in series. As discussed above in connection with method 900, it often is advisable to place a plurality of piezoelectric resonators as the first piezoelectric resonance arrangement. As a further example, the ladder filter block 1190 may be replaced, for example, with the filter block 1090 of FIG. 10. A plurality of piezoelectric resonators connected in parallel between the input and output conductors and directly to an input conductor further enhances the power handling capacity of a filter.

One ladder filter, which has the same structure as ladder filter 1100, where the piezoelectric resonators are piezoelectric BAW resonators having ZnO as the piezoelectric material, where the plurality 1110 consists of two piezoelectric BAW resonators and the center frequency of which ladder filter is 942.5 MHz, is found to withstand the power of 33 dBm. A corresponding ladder filter, where the plurality 1110 is replaced with a corresponding single piezoelectric BAW resonator, is capable of handling the power of 30 dBm. By using a plurality 1110, which has more than two piezoelectric resonators, it is possible to increase the power handling capacity of this example ladder filter even more.

FIG. 12 illustrates as an example a circuit corresponding to a lattice filter structure 1200 according to a fourth preferred embodiment of the invention. The lattice filter structure 1200 comprises four pluralities of piezoelectric resonators. In this lattice filter structure 1200, the pluralities 1210a, 1210b are connected in series between the input conductors 1030a, 1030b and output conductor 1040a and 1040b and the pluralities 1220a, 1220b are connected as parallel between the input conductors and the output conductors. The pluralities 1210a and 1210b are typically identical (or as identical as it is possible to manufacture), as well as pluralities 1220a and 1220b. Compared to a prior art lattice filter, in lattice filter structure 1200 the first resonator in series and the first resonator in parallel are replaced with pluralities of piezoelectric resonators. To keep the filter structure symmetric, also the rest of the resonators in a prior art lattice filter are replaced with pluralities of piezoelectric resonators. In filter structure 1200, as an example, a plurality 1210a, 1210b consists of two piezoelectric resonators and a plurality 1220a, 1220b consists of three piezoelectric resonator.

The piezoelectric resonators belonging to said pluralities 1210a, 1210b, 1220a, 1220b may be, for example, piezoelectric BAW resonators, which are formed by patterning a piezoelectric layer into separate blocks of piezoelectric material, each BAW resonator thus comprising such a separate block of piezoelectric material. These piezoelectric BAW resonators are typically connected to each other using vias, which are made through a protective layer. Alternatively, it is possible that the BAW resonators are formed using a single piezoelectric layer into which a necessary number of vias is formed for connecting the BAW resonators to each other and/or to the other filter circuitry. Alternatively, the piezoelectric resonators belonging to said pluralities 1210a, 1210b, 1220a, 1220b may be, for example, piezoelectric SAW resonators. Typically when a filter comprises piezoelectric resonators, only either BAW or SAW resonators are used in a filter structure.

Filter structures in FIGS. 10–12 are presented as examples of filter structures according to the invention. It is possible to construct various other filter structures falling within the scope of the accompanying claims. Especially, a filter structure according to the invention may have more than one plurality of piezoelectric resonators connected in series.

Figure 13A:
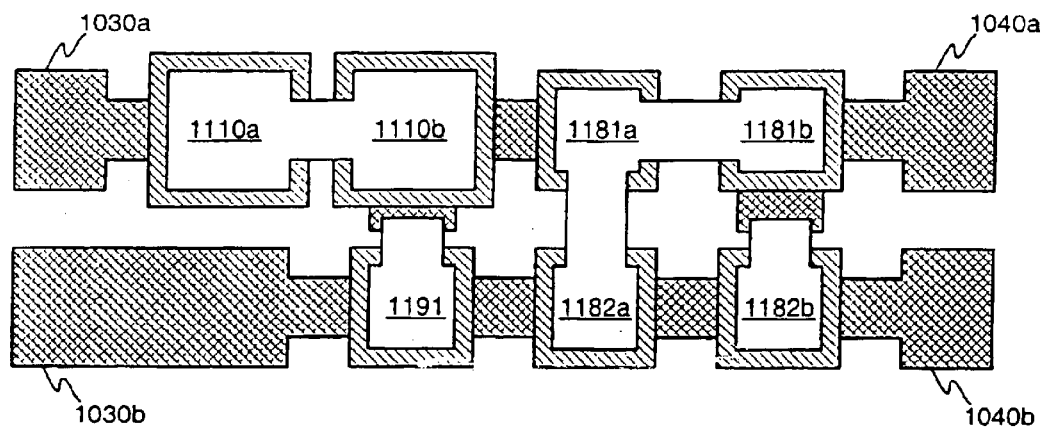
Figure 13B:
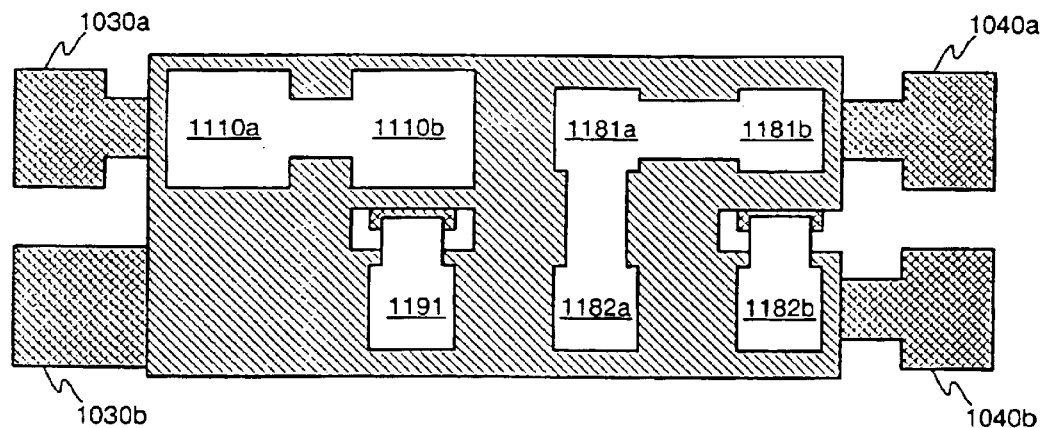

BAW resonators connected in series may be constructed using either a patterned or unpatterned piezoelectric layer. FIG. 13 illustrates two examples of constructing a filter structure 1200; in these examples patterned piezoelectric layer is used. The conducting material forming, for example, bottom electrodes of BAW resonators and the input and output conductors, is marked with crossed lines. The conducting material forming the top electrodes of BAW resonators and part of the connecting circuitry is plain white. The piezoelectric layer is marked with diagonal lines. The BAW resonators 1110a and 1110b form the piezoelectric resonators marked with 1110 in FIG. 11. In FIG. 13a the piezoelectric layer is patterned so that each BAW resonator belonging to said filter structure is formed of a separate block of piezoelectric material. FIG. 13b illustrates a second example, where a number of vias for connecting at least one of the BAW resonators of the filter structure to the filter circuitry is formed. It is possible that only one via is needed for this purpose. The use of unpatterned piezoelectric layer (not shown in FIG. 13) means that practically the whole area of the filter circuitry is covered with a piezoelectric layer.

Filters comprising SAW resonators are typically constructed on a disc (substrate) formed of a piezoelectric crystal. The electrodes of SAW resonators are typically deposited on one surface of the piezoelectric crystal. The SAW resonators are typically connected to each other using the same conducting layer, whereof the electrodes are formed, and/or using bonding wires.

In many cellular systems, for example, the transmission and reception of a signal occurs at different frequencies. If the transmission occurs at a first frequency band and the reception occurs at a second frequency band, a duplex filter is used to separate the transmitted and received signals from each other. A duplex filter has two filter branches, and the pass bands of the filter branches are different. A duplex filter connected to an antenna thus allows transmission of signals at first frequency band and reception of signals at a second frequency band. Furthermore, it is possible that transmission and/or reception of signals occurs at various frequency bands, not only using one frequency band. It is possible to design a filter enabling transmission and reception of signals also in this case.

FIG. 14 illustrates schematically a further filter structure 1400 in accordance with the invention. This filter structure 1400 is typically used in radio transceivers, and FIG. 14 shows, how it is connected to an antenna. The filter structure 1400 comprises a first filter branch 1401 for filtering signals to be transmitted and a second filter branch 1402 for filtering signals, which are received. The output of the first filter structure is typically common with the input of the second filter structure, and it is usually called antenna port. Filter structure 1400 may be, for example, a duplex filter.

The pass band or pass bands of the first filter branch is/are different from that/those of the second filter branch, and a filter structure 1400 therefore separates transmitted signals from received ones. Transmitted signals, whose frequency band is different from that of received signals, experience the second filter branch 1402 as a high impedance and do not enter the second filter branch. In cellular systems, the power of a transmitted signal may be, for example, at maximum 2 W. The power of received signals, on the other hand, may be of the order of −100 dBm. Similarly, a received signal experiences the first filter branch as a high impedance, and enters the second filter branch. This way practically all the received signal power enters the receiver circuitry.

In a filter structure 1400, the first filter branch comprises a plurality of piezoelectric filter connected in series in accordance with the invention. The first filter branch may, for example, comprise a ladder filter structure 1100 or a lattice filter structure 1200. None restrictions are posed on the structure of the second filter branch 1402 in a filter structure 1400, as typically the power level of a received signal are so small that power handling capacity does not cause problems there. A filter structure 1400 is advantageously used in mobile communication devices.

FIG. 15 illustrates an example of an arrangement 1500 for transmitting and receiving radio frequency signals. This arrangement comprises, in addition to a filter structure 1400, a local oscillator 1502 and a modulator 1501, which produces a signal carrying the data to be transmitted. The carrier signal from the local oscillator and signal from the modulator are mixed, and the resulting signal is thereafter amplified with a power amplifier 1503. The amplified signal is filtered in the first filter branch 1401 of the filter structure 1400; multiples of the transmission frequency, for example, are filtered off. An impedance matching element 1504 is typically needed between the power amplifier 1503 and the first filter branch 1401.

The output of the second filter branch 1402 of a filter structure 1400 in an arrangement is typically connected to a low noise amplifier 1505, which amplifies the received signal before further processing.

FIG. 16 illustrates an arrangement 1600 for transmitting radio frequency signal. Such an arrangement may, for example, be part of a mobile communication device. It is otherwise similar to the arrangement 1500, but a filter structure 1601 couples the power amplifier 1503 to the antenna. This filter structure may be, for example, filter structure 1100 or 1200, or any other filter structure in accordance with the invention having good power handling capabilities.

Term bulk acoustic resonator in the accompanying claims refers to a structure having a piezoelectric layer and a first electrode on one side of said piezoelectric layer and a second electrode on opposite side of said piezoelectric layer. The structure may further have, for example, additional piezoelectric layers and additional electrodes.

Term surface acoustic wave resonator in the accompanying claims and in this description refers to a structure having at least two electrodes on a surface of a piezoelectric material, said piezoelectric material typically being a single piezoelectric crystal.

Term connect and derivatives therefrom in the accompanying claims and in this description refer to galvanic connection. Term couple and derivatives therefrom in the accompanying claims and in this description refer to electrical—not necessarily galvanic—coupling. For example, two components coupled together may be each galvanically connected to an intermediate electrical component.

What is claimed is:

1. A filter structure having a certain impedance level and having a first piezoelectric resonator, whose resonance frequency is a first resonance frequency and which is connected to an input conductor of said filter structure, said filter structure comprising, in order to increase the power handling capacity of the filter structure, a chain of piezoelectric resonators, said chain comprising at least two piezoelectric resonators, connected in series with the first piezoelectric resonator and forming together with the first piezoelectric resonator a plurality of piezoelectric resonators connected in series, and wherein each piezoelectric resonator belonging to said chain of piezoelectric resonators has a resonance frequency substantially equal to the first resonance frequency, said plurality of piezoelectric resonators is connected to the rest of the filter structure only through the first piezoelectric resonator at one end of said plurality of piezoelectric resonators connected in series and through a second piezoelectric resonator, which is at the other end of said plurality of piezoelectric resonators connected in series, and impedance of said plurality of piezoelectric resonators connected in series is arranged to match the impedance level of the filter structure, wherein said filter structure is a lattice filter structure.

2. A filter structure according to claim 1, further comprising a second plurality of piezoelectric resonators connected in series, said plurality comprising at least two piezoelectric resonators, and wherein each piezoelectric resonator belonging to said second plurality of piezoelectric resonators has a resonance frequency equal to a second resonance frequency, said second plurality of piezoelectric resonators is connected to the rest of the filter structure only through a third piezoelectric resonator at one end of said second plurality of piezoelectric resonators connected in series and through a fourth piezoelectric resonator, which is at the other end of said second plurality of piezoelectric resonators connected in series, and the impedance of said second plurality of piezoelectric resonators connected in series is arranged to match the impedance level of the filter structure.

3. A filter structure according to claim 2, wherein the first resonance frequency is substantially equal to the second resonance frequency.

4. A filter structure according to claim 2, wherein the first resonance frequency is different from the second resonance frequency.

5. A filter structure according to claim 2, wherein said third piezoelectric resonator is connected to a second input conductor of said filter structure.

6. A filter structure according to claim 1, wherein said first piezoelectric resonator and said second piezoelectric resonator are bulk acoustic wave resonators.

7. A filter structure according to claim 1, wherein said piezoelectric resonators forming said plurality of piezoelectric resonators are bulk acoustic wave resonators.

8. A filter structure according to claim 7, wherein said bulk acoustic wave resonators are formed on an unpatterned layer of piezoelectric material.

9. A filter structure according to claim 1, wherein said first piezoelectric resonator and said second piezoelectric resonator are surface acoustic wave resonators.

10. A filter structure having a certain impedance level and having a first piezoelectric resonator, whose resonance frequency is a first resonance frequency and which is connected to an input conductor of said filter structure, said filter structure comprising, in order to increase the power handling capacity of the filter structure, a chain of piezoelectric resonators, said chain comprising at least two piezoelectric resonators, connected in series with the first piezoelectric resonator and forming together with the first piezoelectric resonator a plurality of piezoelectric resonators connected in series, and wherein each piezoelectric resonator belonging to said chain of piezoelectric resonators has a resonance frequency substantially equal to the first resonance frequency, said plurality of piezoelectric resonators is connected to the rest of the filter structure only through the first piezoelectric resonator at one end of said plurality of piezoelectric resonators connected in series and through a second piezoelectric resonator, which is at the other end of said plurality of piezoelectric resonators connected in series, and impedance of said plurality of piezoelectric resonators connected in series is arranged to match the impedance level of the filter structure, wherein said first piezoelectric resonator and said second piezoelectric resonator are bulk acoustic wave resonators, said piezoelectric resonators forming said plurality of piezoelectric resonators are bulk acoustic wave resonators, and said bulk acoustic wave resonators are formed on a patterned layer of piezoelectric material.

11. A filter structure according to claim 10, wherein said bulk acoustic wave resonators are formed on separate blocks of piezoelectric material.

12. An arrangement for transmitting and receiving radio frequency signal, comprising first amplification means for amplifying a first signal, second amplification means for amplifying a second signal, and a filter structure comprising a first filter branch for filtering the first signal, said first filter branch having a first input conductor, a first output conductor and a plurality of piezoelectric resonators connected in series, said plurality having at least two piezoelectric resonators, a second filter branch for filtering the second signal, said second filter branch having a second input conductor and a second output conductor, wherein said first output conductor is connected to said second input conductor, said first input conductor is coupled to an output of the first amplification means and said second output conductor is coupled to an input of the second amplification means, each piezoelectric resonator belonging to said plurality of piezoelectric resonators has a substantially same resonance frequency, said plurality of piezoelectric resonators is connected to the rest of the first filter branch only through a first piezoelectric resonator at one end of said plurality of piezoelectric resonators connected in series, said first piezoelectric resonator being connected to the first input conductor, and through a second piezoelectric resonator, which is at the other end of said plurality of piezoelectric resonators connected in series and impedance of said plurality of piezoelectric resonators connected in series is arranged to match the impedance level of the first filter branch, wherein said first piezoelectric resonator and said second piezoelectric resonator are bulk acoustic wave resonators, and said bulk acoustic wave resonators are formed on a patterned layer of piezoelectric material.

13. An arrangement according to claim 12, wherein a passband of the first filter branch is different from the passband of the second filter branch.

14. A filter structure having a certain impedance level and having a first surface acoustic wave resonator, whose resonance frequency is a first resonance frequency and which is connected to an input conductor of said filter structure, said filter structure comprising, in order to increase the power handling capacity of the filter structure, a second surface acoustic wave resonator, a first electrode of said first surface acoustic wave resonator being connected to a first electrode of said second surface acoustic wave resonator, and said second surface acoustic wave resonator forming together with the first surface acoustic wave resonator a plurality of piezoelectric resonators connected in series, and wherein each piezoelectric resonator belonging to said plurality of piezoelectric resonators has a resonance frequency substantially equal to the first resonance frequency, said plurality of piezoelectric resonators is connected to the rest of the filter structure only through a second electrode of the first surface acoustic wave resonator and through a second electrode of the second surface acoustic wave resonator, and impedance of said plurality of piezoelectric resonators connected in series is arranged to match the impedance level of the filter structure, wherein said filter structure is a lattice filter structure.

15. A filter structure according to claim 14, further comprising a second plurality of piezoelectric resonators connected in series, said plurality comprising at least two piezoelectric resonators, and wherein each piezoelectric resonator belonging to said second plurality of piezoelectric resonators has a resonance frequency equal to a second resonance frequency, said second plurality of piezoelectric resonators is connected to the rest of the filter structure only through a third piezoelectric resonator at one end of said second plurality of piezoelectric resonators connected in series and through a fourth piezoelectric resonator, which is at the other end of said second plurality of piezoelectric resonators connected in series, and the impedance of said second plurality of piezoelectric resonators connected in series is arranged to match the impedance level of the filter structure.

16. A filter structure according to claim 15, wherein the first resonance frequency is substantially equal to the second resonance frequency.

17. A filter structure according to claim 15, wherein the first resonance frequency is different from the second resonance frequency.

18. A filter structure according to claim 15, wherein said third piezoelectric resonator is connected to a second input conductor of said filter structure.

19. An arrangement for transmitting radio frequency signal, comprising amplification means for amplifying a radio frequency signal, and a filter structure for filtering the amplified radio frequency signal, said filter structure comprising a plurality of piezoelectric resonators connected in series, said plurality having at least two piezoelectric resonators, wherein each piezoelectric resonator belonging to said plurality of piezoelectric resonators has a substantially same resonance frequency, said plurality of piezoelectric resonators is connected to the rest of the filter structure only through a first piezoelectric resonator at one end of said plurality of piezoelectric resonators connected in series, said first piezoelectric resonator being connected to an input conductor of said filter structure, and through a second piezoelectric resonator, which is at the other end of said plurality of piezoelectric resonators connected in series, and impedance of said plurality of piezoelectric resonators connected in series is arranged to match the impedance level of the filter structure, wherein said first and second piezoelectric resonators are bulk acoustic wave resonators.

20. An arrangement according to claim 19, wherein, a passband of a first filter branch of the filter structure is different from the passband of a second filter branch of the filter structure.

21. A filter structure having a certain impedance level and having a first bulk acoustic wave resonator, whose resonance frequency is a first resonance frequency and which is connected to an input conductor of said filter structure, said filter structure further comprising, in order to increase the power handling capacity of the filter structure, a second bulk acoustic wave resonator, a first electrode of said first bulk acoustic wave resonator being connected to a first electrode of said second bulk acoustic wave resonator, and said second bulk acoustic wave resonator forming together with the first bulk acoustic wave resonator a plurality of piezoelectric resonators connected in series, and wherein each piezoelectric resonator belonging to said plurality of piezoelectric resonators has a resonance frequency substantially equal to the first resonance frequency, said plurality of piezoelectric resonators is connected to the rest of the filter structure only through a second electrode of the first bulk acoustic wave resonator and through a second electrode of the second bulk acoustic wave resonator, the first bulk acoustic wave resonator and the second bulk acoustic wave resonator are not formed using a single unpatterned piezoelectric layer, and impedance of said plurality of piezoelectric resonators connected in series is arranged to match the impedance level of the filter structure.

22. A filter structure according to claim 21, further comprising a second plurality of piezoelectric resonators connected in series, said plurality comprising at least two piezoelectric resonators, and wherein each piezoelectric resonator belonging to said second plurality of piezoelectric resonators has a resonance frequency equal to a second resonance frequency, said second plurality of piezoelectric resonators is connected to the rest of the filter structure only through a third piezoelectric resonator at one end of said second plurality of piezoelectric resonators connected in series and through a fourth piezoelectric resonator, which is at the other end of said second plurality of piezoelectric resonators connected in series, and the impedance of said second plurality of piezoelectric resonators connected in series is arranged to match the impedance level of the filter structure.

23. A filter structure according to claim 22, wherein the first resonance frequency is substantially equal to the second resonance frequency.

24. A filter structure according to claim 22, wherein the first resonance frequency is different from the second resonance frequency.

25. A filter structure according to claim 22, wherein said third piezoelectric resonator is connected to a second input conductor of said filter structure.

26. A filter structure according to claim 21, wherein said filter structure is a ladder filter structure.

27. A filter structure according to claim 21, wherein said filter structure is a lattice filter structure.

28. A filter structure according to claim 21, wherein said first and second bulk acoustic wave resonators are formed on a patterned layer of piezoelectric material and connected together using vias.

29. A filter structure according to claim 21, wherein said first and second bulk acoustic wave resonators are formed on separate blocks of piezoelectric material.

30. A filter structure for transmitting a radio frequency signal, comprising a first filter branch for filtering a first signal, said first filter branch having a first input conductor, a first output conductor and a plurality of piezoelectric resonators connected in series, said plurality having at least two piezoelectric resonators, and a second filter branch for filtering a second signal, said second filter branch having a second input conductor and a second output conductor and said first output conductor being connected to said second input conductor, wherein each piezoelectric resonator belonging to said plurality of piezoelectric resonators has a substantially same resonance frequency, said plurality of piezoelectric resonators is connected to the rest of the first filter branch only through a first piezoelectric resonator at one end of said plurality of piezoelectric resonators connected in series, said first piezoelectric resonator being connected to the first input conductor, and through a second piezoelectric resonator, which is at the other end of said plurality of piezoelectric resonators connected in series, and impedance of said plurality of piezoelectric resonators connected in series is arranged to match the impedance level of the first filter branch, wherein said first and second piezoelectric resonators are bulk acoustic wave resonators formed on separate blocks of a patterned layer of piezoelectric material.

31. A filter structure according to claim 30, wherein a passband of the first filter branch is different from the passband of the second filter branch.

32. A method for designing a filter comprising the following steps of:
  specifying a filter construction, which comprises piezoelectric resonators, said filter construction achieving a target frequency response,
  replacing in the filter construction an original piezoelectric resonator having a first resonance frequency with a plurality of piezoelectric resonators, each of which has a resonance frequency substantially equal to the first resonance frequency, and the impedance of the plurality of piezoelectric resonators being connected in series being the same as the impedance of the original piezoelectric resonator, and
  selecting the number of piezoelectric resonators in said plurality of piezoelectric resonators, wherein the method further comprises the steps of:
  defining a target power handling capacity,
  determining a power handling capacity of the filter construction having the plurality of piezoelectric resonators, and
  determining a frequency response of the filter construction having the plurality of piezoelectric resonators,
  and in the step of selecting the number of piezoelectric resonators in said plurality of piezoelectric resonators, the selection is performed so that a balance between the power handling capacity of the filter structure and the frequency response of the filter construction is achieved.

* * * * *

UNITED STATES PATENT AND TRADEMARK OFFICE
CERTIFICATE OF CORRECTION

PATENT NO. : 6,741,145 B2
DATED : May 24, 2004
INVENTOR(S) : P. Tikka and J. Ella It is certified that error appears in the above-identified patent and that said Letters Patent is hereby corrected as shown below:

Column 17,
Line 34, "claim 1" should read -- claim 6 --

Signed and Sealed this

First Day of February, 2005

JON W. DUDAS
*Director of the United States Patent and Trademark Office*

UNITED STATES PATENT AND TRADEMARK OFFICE
CERTIFICATE OF CORRECTION

PATENT NO.     : 6,741,145 B2                                                   Page 1 of 1
DATED          : May 25, 2004
INVENTOR(S)    : P.Tikka and J. Ella It is certified that error appears in the above-identified patent and that said Letters Patent is hereby corrected as shown below:

Column 17,
Line 34, "claim 1" shouldread -- claim 6 --

This certificate supersedes Certificate of Correction issued February 1, 2005.

Signed and Sealed this

Seventeenth Day of May, 2005

JON W. DUDAS
*Director of the United States Patent and Trademark Office*